(12) United States Patent
Potrawa et al.

(10) Patent No.: US 11,873,432 B2
(45) Date of Patent: Jan. 16, 2024

(54) LUMINESCENT MATERIALS INCLUDING A LUMINESCENT BENZOTHIAZOLE, ARTICLES INCLUDING A SECURITY FEATURE, AND METHODS OF FORMING LUMINESCENT PARTICLES INCLUDING A LUMINESCENT BENZOTHIAZOLE

(71) Applicant: HONEYWELL INTERNATIONAL INC., Morris Plains, NJ (US)

(72) Inventors: Thomas Potrawa, Seelze (DE); Michael Kessler, Neustadt (DE)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 0 days.

(21) Appl. No.: 16/695,867

(22) Filed: Nov. 26, 2019

(65) Prior Publication Data
US 2020/0172803 A1 Jun. 4, 2020

Related U.S. Application Data

(60) Provisional application No. 62/772,860, filed on Nov. 29, 2018.

(51) Int. Cl.
*C09K 11/06* (2006.01)
(52) U.S. Cl.
CPC ...... *C09K 11/06* (2013.01); *C09K 2211/1037* (2013.01)
(58) Field of Classification Search
CPC .................. C09K 11/06; C09K 2211/104
See application file for complete search history.

(56) References Cited

U.S. PATENT DOCUMENTS

| 3,162,642 A | 12/1964 | McCafferty |
| 2008/0081913 A1* | 4/2008 | Sabic ............... C09K 11/06 548/152 |

FOREIGN PATENT DOCUMENTS

| GB | 895001 A | 4/1962 | |
| WO | WO-2021010340 A1 * | 1/2021 | ............... G02B 5/30 |

OTHER PUBLICATIONS

Narasaiah, T., et al. "Synthesis, Spectral Characterization and Antimicrobial Activity of Novel Urea/Thiourea Derivatives." Indo American Journal of Pharmaceutical Sciences. (2015), vol. 2, Issue 3, pp. 714-721 (Year: 2015).*
Narasaiah T et al. "Synthesis and Antimicrobial Activity of Novel Urea/Thiourea Derivatives", Journal of Applicable Chemistry, Lumami, India, vol. 8, No. 2, Feb. 3, 2019, pp. 546-554, XP055941208, URL: http://www.joac.info/Default.aspx.

* cited by examiner

*Primary Examiner* — John S Kenyon
(74) *Attorney, Agent, or Firm* — LORENZ & KOPF, LLP

(57) ABSTRACT

Luminescent materials that include a luminescent phosphor compound, articles including a security feature, and methods for producing the luminescent phosphor compounds are provided herein. In an embodiment, a luminescent material includes a medium and luminescent particles. The luminescent particles include a luminescent benzothiazole having a ureido linkage. The luminescent benzothiazole has a peak intensity within a wavelength of from about 555 to about 630 nm in response to excitation with electromagnetic radiation at a wavelength of about 366 nm.

11 Claims, 3 Drawing Sheets

LUMINESCENT MATERIALS INCLUDING A LUMINESCENT BENZOTHIAZOLE, ARTICLES INCLUDING A SECURITY FEATURE, AND METHODS OF FORMING LUMINESCENT PARTICLES INCLUDING A LUMINESCENT BENZOTHIAZOLE

CROSS-REFERENCE TO RELATED APPLICATIONS

This application claims the benefit of U.S. Provisional Application No. 62/772,860, filed Nov. 29, 2018.

TECHNICAL FIELD

The technical luminescent materials that include a luminescent phosphor compound, articles including a security feature, and methods for producing the luminescent phosphor compounds. More specifically, the technical field relates to luminescent materials and security articles that incorporate luminescent particles including luminescent benzothiazole, and methods for the production of such luminescent particles.

BACKGROUND

A luminescent phosphor compound is a compound that is capable of emitting detectable quantities of radiation in the infrared, visible, and/or ultraviolet spectrums upon excitation of the compound by an external energy source such as electromagnetic radiation. Luminescent phosphor compounds find widespread use in a variety of fields including, but not limited to, lighting devices, cathode ray tubes, glow-in-the-dark articles, and security indicia. Luminescent phosphor compounds can generally be characterized as inorganic or organic luminescent phosphor compounds. Inorganic luminescent phosphor compounds generally include a host material (e.g., a crystal lattice), an emitting ion (e.g., of a rare earth metal), and in some cases, a "sensitizing" ion (e.g., of a transition metal or of a different rare earth metal that can absorb and transfer the energy to the emitting rare earth metal ion). A variety of organic luminescent phosphor compounds are known, many of which are based upon aromatic chemistry. For example, various organic luminescent phosphor compounds may be oxinates; derivatives of terephthalic acid; derivatives of anthranilic acid such as benzimidazole, benzothiazole, benzoxazinone, or quinazolinone; thioxanthenes; salicylic acid derivatives; or organic complexes of rare earth metals.

The selected chemistry of a luminescent phosphor compound may cause the compound to have particular emission properties, including emissions with a given spectra as well various temporal properties. The unique spectral properties of some phosphor compounds make them well suited for use in authenticating or identifying articles of particular value or importance (e.g., banknotes, passports, biological samples, and so on). Accordingly, luminescent phosphor compounds with known spectral signatures have been incorporated into various types of articles to enhance the ability to detect forgeries or counterfeit copies of such articles, or to identify and track the articles. For example, luminescent phosphor compounds have been incorporated into various types of articles in the form of additives, coatings, and printed or otherwise applied features that may be analyzed in the process of authenticating or tracking an article.

An article that includes a luminescent phosphor compound may be authenticated using specially designed authentication equipment through known authentication techniques. While such authentication techniques are highly effective at detecting and thwarting relatively unsophisticated forgery and counterfeiting activities, they do exhibit drawbacks. For example, individuals with the appropriate resources and equipment may be able to employ spectrometry techniques in order to determine the components of some phosphor compounds. The phosphor compounds may then be reproduced and used with unauthentic articles, thus compromising the authentication benefits that may otherwise be provided by a particular phosphor compound.

For certain applications, emissions within the visible spectrum are desired, with spectral emission of a particular visible color desired. Various inorganic and organic luminescent phosphors have been identified that produce detectable emissions at various emission wavelengths. However, it is desirable to further develop luminescent phosphor chemistries within certain under-developed portions of the electromagnetic spectrum. Particularly, known chemistries for organic luminescent phosphor compounds that emit in the visible yellow to orange portion of the electromagnetic spectrum, such as from about 555 to about 630 nm, are somewhat limited.

Various urea/thiourea derivatives, including benzothiazole-containing compounds that contain a ureido linkage, have been developed for various uses. For example, benzothiazole-containing compounds have been proposed for antimicrobial applications. However, prior efforts to produce such materials have exhibited relatively low yields, and no suggestion has been made for use of such materials outside of the field of antimicrobials.

Accordingly, although a number of luminescent phosphor compounds have been developed that emit electromagnetic radiation within various portions of the visible electromagnetic spectrum, it is desirable to develop additional compounds, which may render forgery and counterfeiting activities more difficult, which may prove beneficial for identifying and tracking articles of particular interest, and/or which may prove useful in other applications in which emissions in the visible portion of the electromagnetic spectrum are desired. Furthermore, other desirable features and characteristics of the present invention will become apparent from the subsequent detailed description of the invention and the appended claims, taken in conjunction with the accompanying drawings and this background of the invention.

BRIEF SUMMARY

Luminescent materials that include a luminescent phosphor compound, articles including a security feature, and methods for producing the luminescent phosphor compounds are provided herein. In an embodiment, a luminescent material includes a medium and luminescent particles. The luminescent particles include a luminescent benzothiazole having a ureido linkage. The luminescent benzothiazole has a peak intensity within a wavelength of from about 555 to about 630 nm in response to excitation with electromagnetic radiation at a wavelength of about 366 nm.

In another embodiment, an article is provided that includes a substrate and an authentication feature in and/or on the substrate. The authentication feature includes luminescent particles. The luminescent particles include a luminescent benzothiazole having a ureido linkage. The luminescent benzothiazole has a peak intensity within a wavelength of from about 555 to about 630 nm in response to excitation with electromagnetic radiation at a wavelength of about 366 nm.

In another embodiment, a method of forming luminescent particles is provided. The method includes heating a mixture including an amino-functional benzothiazole reactant and an organic solvent to a temperature of greater than about 60° C. An isocyanate-containing compound is added to the mixture after heating to the temperature of greater than about 60° C. to form a reaction mixture. The reaction mixture is maintained at the temperature of greater than about 60° C. for a reaction period to form luminescent particles including a luminescent benzothiazole having a ureido linkage.

BRIEF DESCRIPTION OF THE DRAWINGS

The present invention will hereinafter be described in conjunction with the following drawing figures, wherein like numerals denote like elements.

DETAILED DESCRIPTION

Figure 1:
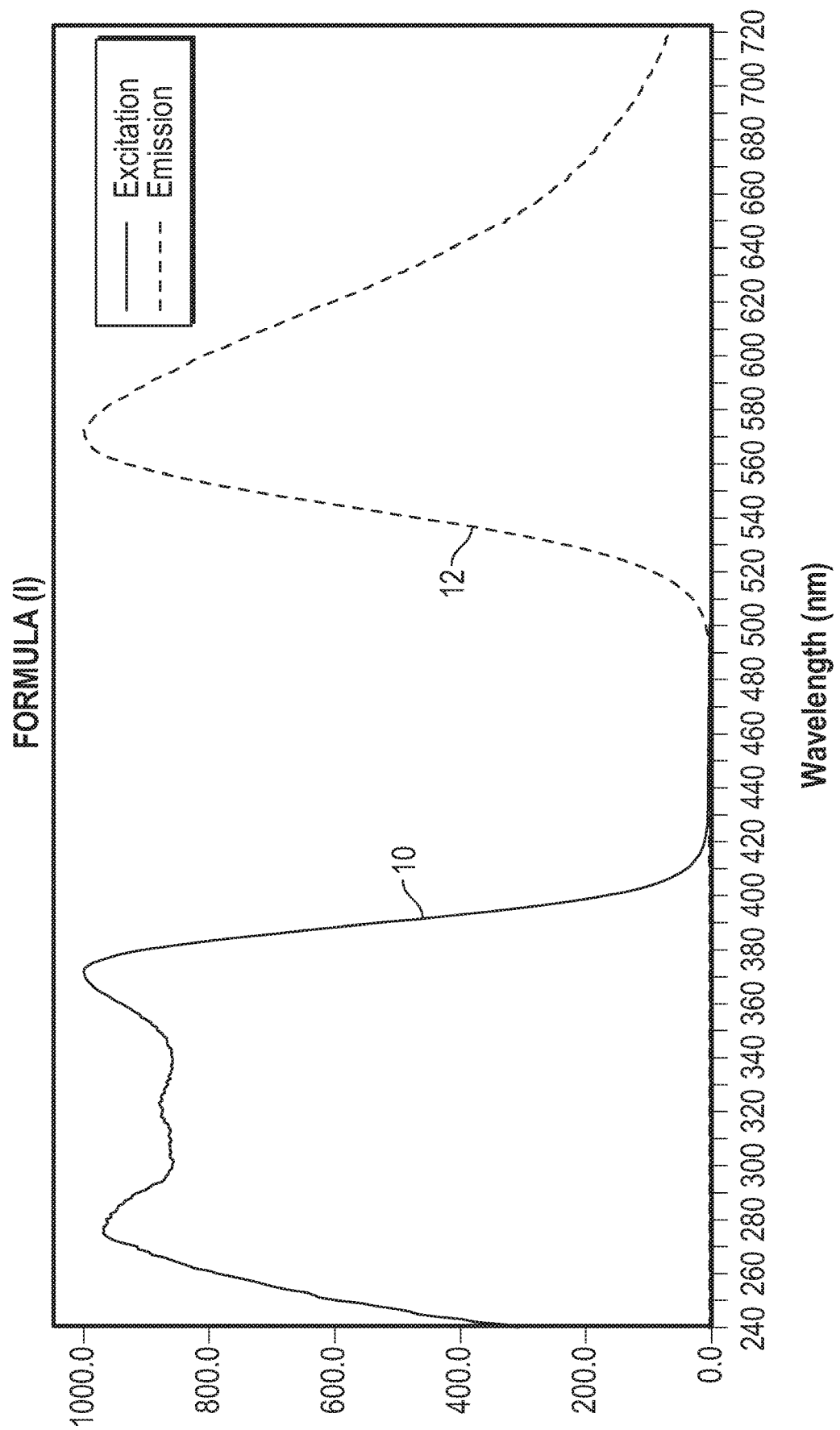
FIG. 1 is a graph illustrating excitation and emission spectra for an exemplary sample of luminescent particles in accordance with an embodiment.

The following detailed description is merely exemplary in nature and is not intended to limit luminescent materials, articles including a security feature, and methods for producing luminescent phosphor compounds as described herein. Furthermore, there is no intention to be bound by any theory presented in the preceding background or the following detailed description.

Embodiments discussed in detail below relate to luminescent particles that include a luminescent benzothiazole, as well as luminescent materials, articles, and methods of forming the luminescent particles that include the luminescent benzothiazole. The embodiments of luminescent particles described below increase the diversity of available materials that may be used for authentication or identification, with the luminescent particles providing emission spectra in the yellow to orange portion of the electromagnetic spectrum, such as from about 555 to about 630 nm, in response to excitation with electromagnetic radiation at a wavelength of about 366 nm. The spectral signature of the emissions from the luminescent particles discussed herein may be used as measurable qualities for the purpose of authentication, and may find other use where luminescent emissions in the yellow to orange portion of the visible spectrum is desired. Further, methods of forming the luminescent particles are provided herein that enable relatively high yield of luminescent benzothiazole to be realized, resulting in luminescent particles with minimized particle off-coloring and excellent emission performance.

As referred to herein, the term "about" is intended to encompass numerical values that would be expected to be effectively the same or result in similar properties to the recited value, such as numerical values within 10% of the recited value or, alternatively within 5% of the recited value. For example, a value of "about 555 nm" could also effectively encompass a value of 550 nm, or alternatively a value of 553 nm, provided that the effect of the difference does not represent a material difference in the underlying physical property (e.g., visible color to the human eye). As also used herein, the term "average D99 particle size" is defined as a mass volume 99 percent point (D99) particle size mean diameter, as measured by a laser light diffraction type of measurement device, such as a device produced by Microtrac Inc. of Montgomeryville, PA.

Embodiments of luminescent particles will now be described, with the luminescent particles suitable for including in a luminescent material or an article as described in further detail below. The luminescent particles include a luminescent benzothiazole, and may optionally include trace amounts of other chemical species that remain after formation of the luminescent particles. In embodiments, the luminescent particles include the luminescent benzothiazole in an amount of at least 99 weight %, such as at least 99.5 weight %, based upon a total weight of the luminescent particles. In embodiments, the aforementioned concentrations of the luminescent benzothiazole are achieved after formation of the luminescent particles, without further purification of the luminescent particles as obtained as dried precipitate. In embodiments, the luminescent particles are provided with an average D99 particle size of less than or equal to about 5 m, with luminescent particles of such average particle size being suitable for use in offset printing applications. Such average particle sizes may be achieved after formation of the luminescent particles, without further processing of the luminescent particles as obtained as dried precipitate after formation. Alternatively, the precipitate may be further processed to achieve the target average particle size values.

The luminescent benzothiazole in the luminescent particles has a ureido linkage, which may also be recognized as a divalent urea linkage or a carbamide linkage. More particularly, the ureido linkage joins a benzothiazole-containing portion of the luminescent benzothiazole with an additional portion of the compound. In embodiments, the ureido linkage joins a benzothiazolyl-containing group and an optionally halogenated phenyl group in the luminescent benzothiazole. In embodiments, the benzothiazolyl-containing group is a phenylbenzothiazolyl group and the ureido linkage joins the phenylbenzothiazolyl group to the optionally halogenated phenyl group in the luminescent benzothiazole. More particularly, in embodiments, the ureido linkage is bound directly to the phenyl of the phenylbenzothiazolyl group, and is also bound directly to the phenyl of the optionally halogenated phenyl group. In embodiments, the ureido linkage binds at carbon 2 of the phenyl. In embodiments, the phenylbenzothiazolyl group is free from pendant hydroxyl groups, with the phenyl containing only hydrogen atoms pending therefrom, and it is believed that such features contribute to the observed emissions spectra of the subject luminescent particles.

In specific embodiments, the luminescent benzothiazole has the following structure:

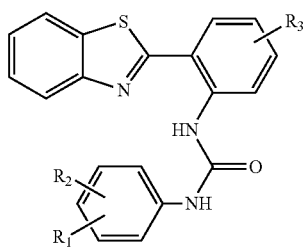

(I)

wherein $R_1$ is H, a halogen radical, an alkyl group, an ester group, an ether group, an aromatic group, or an alkoxy group; $R_2$ is H, a halogen radical, an alkyl group, an ester group, an ether group, an aromatic group, or an alkoxy group, wherein $R_1$ and $R_2$ may represent bonds of an aromatic group to the phenyl group to form a polycyclic aromatic group; and $R_3$ is H, a halogen radical, or an alkyl group. In an embodiment, $R_1$, $R_2$ and $R_3$ are all H. In an embodiment, $R_2$ and $R_3$ are both H and $R_1$ is a group as set forth above other than H. For example, $R_1$ is a halogen radical and, as one specific embodiment, is chlorine. As another example, $R_1$ is an alkyl group, such as methyl. As another example, $R_1$ is an ester group, such as —COOCH$_3$. As another example, $R_1$ is an ether group, such as —COCH$_3$. In another embodiment, $R_1$ and $R_2$ are a group as set forth above other than H. As an example, $R_1$ and $R_2$ represent bonds of an aromatic group to the phenyl group to form a polycyclic aromatic group such as a naphthyl group. As another example, $R_1$ and $R_2$ are both a halogen radical, such as chlorine. In another embodiment, $R_3$ is a halogen radical or an alkyl group. As an example, $R_3$ is a halogen radical, such as chlorine; $R_1$ is H; and $R_2$ is H. As another example, $R_1$ and $R_3$ are halogen radicals, such as chlorine, and $R_2$ is H.

Figure 2:
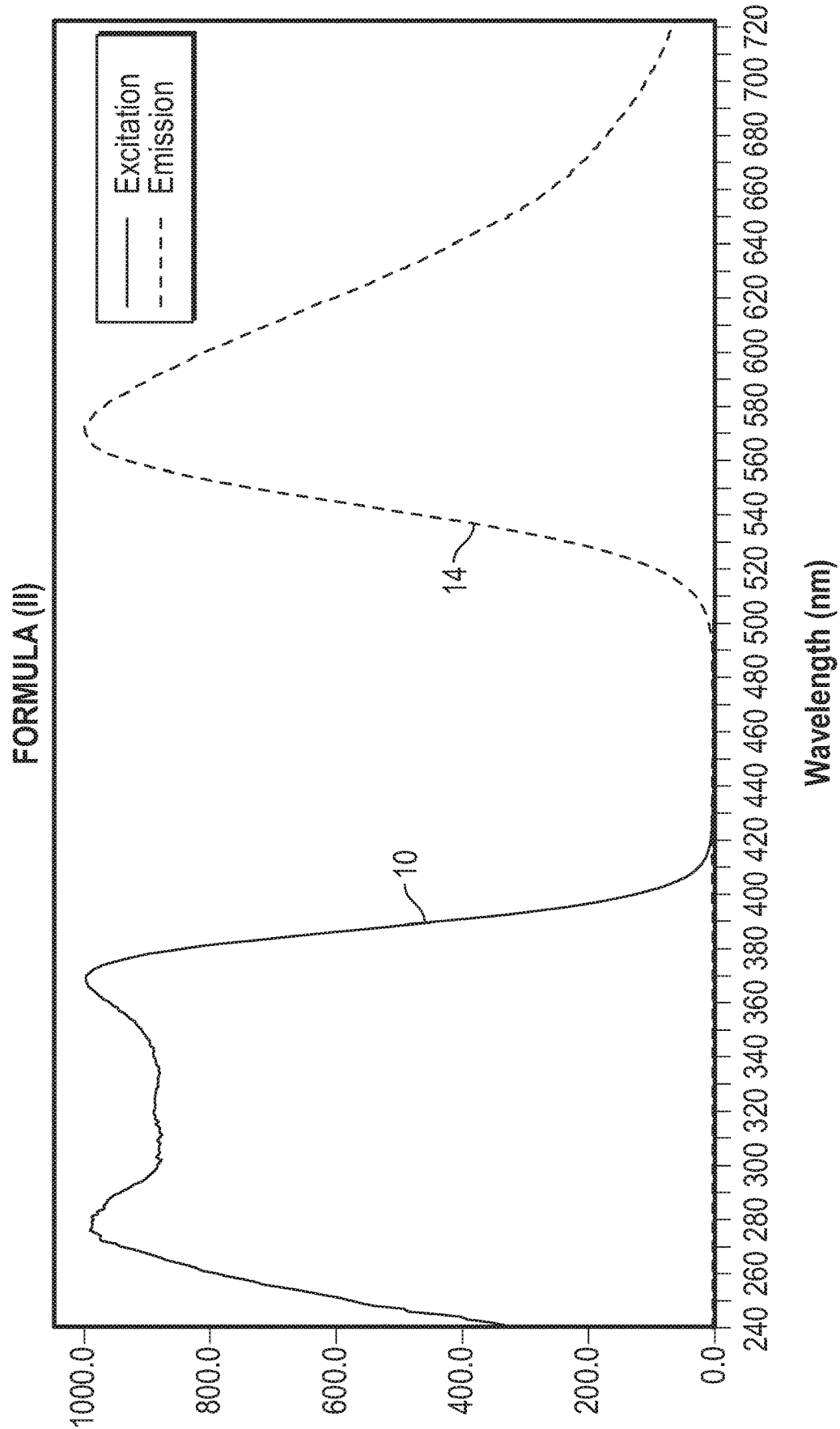
FIG. 2 is a graph illustrating excitation and emission spectra for another exemplary sample of luminescent particles in accordance with an embodiment.

In embodiments, and with reference to FIGS. 1 and 2, the luminescent benzothiazoles as described herein have a peak intensity within a wavelength of from about 555 to about 630 nm, such as from about 555 to about 600, or such as from about 558 to about 589 nm, in response to excitation with electromagnetic radiation at a wavelength of about 366 nm. It is to be appreciated that excitation may be effectuated using a light source that produces electromagnetic radiation over a range of wavelengths, as shown by plot 10 in FIGS. 1 and 2, provided that emissions at the wavelength of about 366 are produced. Referring to FIGS. 1 and 2, excitation and emission spectra for luminescent particles that include the luminescent benzothiazoles of formula (I) and formula (II), respectively, are shown. In particular, referring to FIG. 1, plot 12 illustrates emission spectra for luminescent benzothiazoles of formula (I), and the peak emission is about 572 nm+/−2 nm. Plot 14 of FIG. 2 illustrates emission spectra for luminescent benzothiazoles of formula (II) with the halogen radical present and being chlorine, and the peak emission is about 573 nm+/−2 nm.

An embodiment of a method of forming the luminescent particles will now be described. An amino-functional benzothiazole reactant and an organic solvent may be charged into an appropriate reaction vessel to form a mixture and heated, followed by adding an isocyanate-containing compound to the mixture after heating. In embodiments, the amino-functional benzothiazole reactant is an aminophenylbenzothiazole, particularly 2-aminophenylbenzothiazole. Suitable organic solvents include, but are not limited to, non-protic solvents such as methyl ethyl ketone. In embodiments, the mixture of the amino-functional benzothiazole reactant and the organic solvent is heated to an elevated temperature that is significantly higher than ambient temperature. For example, in embodiments, the mixture is heated to a mixture temperature of greater than about 60° C. In embodiments, the mixture is heated to a sufficiently high mixture temperature, and under appropriate pressure, to achieve stable reflux conditions wherein vapor from the mixture is condensed and returned to the mixture prior to adding the isocyanate-containing compound. It is to be appreciated that appropriate reflux conditions can be readily identified by those of skill in the art based upon the particular components of the mixture. After heating the mixture to the mixture temperature, the isocyanate-containing compound is added to form a reaction mixture. In embodiments, the isocyanate-containing compound is an optionally halogenated phenylisocyanate. The reaction mixture is maintained at the temperature of greater than about 60° C. for a reaction period to form the luminescent particles that include the luminescent benzothiazole. In embodiments, the luminescent particles are separated from as precipitate from a liquid portion of the reaction mixture after the reaction period, with the precipitate optionally washed and dried to remove residual organic solvent and unreacted reactants. In embodiments, the luminescent particles include the luminescent benzothiazole in an amount of at least 99 weight %, such as at least 99.5 weight %, based upon a total weight of the luminescent particles. In embodiments, the aforementioned concentrations of the luminescent benzothiazole are achieved after formation of the luminescent particles, without further purification of the luminescent particles as obtained as dried precipitate. It is believed that the aforementioned methodology maximizes yield of the luminescent particles, with the luminescent particles formed at a yield of at least about 75 weight %, such as a yield of at least about 78 weight %, or such as a yield of at least about 90 weight %, based upon a theoretical yield of the luminescent particles from the reaction.

Figure 3:
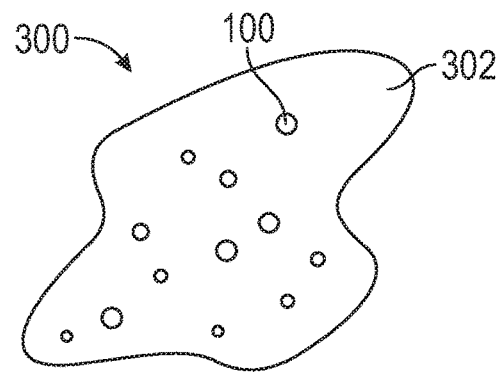
FIG. 3 is a schematic illustration of a luminescent material including a medium and luminescent particles in accordance with an embodiment.

Referring to FIG. 3, the luminescent particles 100 that include the luminescent benzothiazoles, as described herein, may be employed in a luminescent material 300 that includes, in addition to the luminescent particles 100, a medium 302. The medium 302 may be chosen from the group of an ink, an ink additive, a glue, a liquid, a gel, a polymer, a slurry, a plastic, plastic base resin, a glass, a ceramic, a metal, a textile, wood, fiber, paper pulp, and paper. By virtue of including the luminescent particles 100 in the medium 302, the luminescent particles 100 can be employed in security applications that generally make use of such mediums 302 as either a base material for an authentication feature or as a substrate material itself. For example, but not by way of limitation, the medium 302 may correspond to material employed to form a substrate of an article, or the medium may correspond to a material that may be applied to (e.g., printed on, coated on, sprayed on, or otherwise adhered to or bonded to) the surface of an article substrate as an authentication feature, or the medium may correspond to material employed to form a feature that is embedded within a substrate (e.g., an embedded authentication feature, a security thread, and so on). In the former case, the luminescent particles 100 may be incorporated into a substrate material, for example, by combining the luminescent particles 100 with the medium 302 and then forming the substrate with the medium 302, and/or by impregnating the medium 302 with a colloidal dispersion of the luminescent particles 100. Impregnation may be performed, for example, by a printing, dripping, coating or spraying process.

Figure 4:
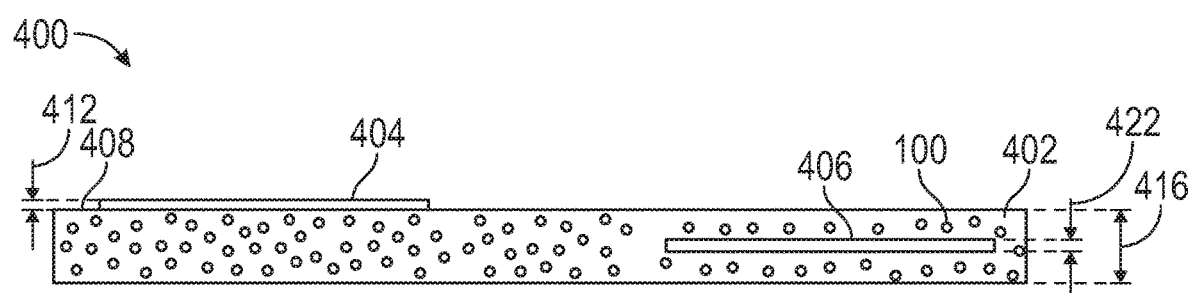
FIG. 4 is a schematic side view of an article including an authentication feature in accordance with an embodiment.

An embodiment of an article that includes the luminescent particles will now be described with reference to FIG. 4. FIG. 4 depicts a cross-sectional view of an article 400 that includes luminescent particles 100, according to an example embodiment. The article 400 includes a substrate 402 and an authentication feature 404, 406 on a surface 408 of the substrate 402 or integrated within the substrate 402, with the authentication feature 404, 406 including the luminescent particles 100. For example, this may be accomplished by incorporating the luminescent material, which includes the medium and luminescent particles 100, in or on the article 400. Alternatively, the luminescent material may actually be employed as the base material for the substrate 402. Conversely, in embodiments in which the luminescent material is applicable to the surface 408 of the substrate 402, the luminescent material may be printed onto one or more surfaces 408 of the substrate 402 in pre-determined locations. Conversely, when the luminescent material corresponds to an embedded authentication feature 406, the embedded authentication feature 406 is integrated with the substrate material when the substrate material is in a malleable form (e.g., when the material is a slurry, molten, or non-cured form). In any one of the above-described manners, the luminescent material or luminescent phosphor compound described herein may be incorporated into the article 400.

As alluded to above, the luminescent particles may be incorporated in or on the article 400. In particular, in this embodiment, the article 400 may include surface-applied and/or embedded authentication features 404, 406 that include the luminescent particles 100, and/or the article 400 may include the luminescent particles 100 evenly or unevenly dispersed within one or more components of the article 400 itself (e.g., within substrate 402 and/or one or more layers or other components of the article 400). The various relative dimensions of the authentication features 404, 406 and the luminescent particles 100 may not be to scale in FIG. 4. Although article 400 is illustrated to include both surface-applied and/or embedded authentication features 404, 406 and luminescent particles 100, another article may include one or a combination of embedded authentication features 406, surface-applied authentication features 404, and dispersed luminescent particles 100. Finally, although only one surface-applied authentication feature 404 and one embedded authentication feature 406 are shown in FIG. 4, an article may include more than one of either type of authentication feature 404, 406.

In various embodiments, article 400 may be any type of article chosen from a group that includes, but is not limited to, identification card, a driver's license, a passport, identity papers, a banknote, a check, a document, a paper, a stock certificate, a packaging component, a credit card, a bank card, a label, a seal, a token, a casino chip, a postage stamp, an animal, and a biological sample.

Substrate 402, which may be rigid or flexible, may be formed from one or more layers or components, in various embodiments. The variety of configurations of substrate 402 are too numerous to mention, as the luminescent particles 100 of the various embodiments may be used in conjunction with a vast array of different types of articles. Therefore, although a simple, unitary substrate 402 is illustrated in FIG. 4, it is to be understood that substrate 402 may have any of a variety of different configurations. For example, a substrate 402 may be a "composite" substrate that includes a plurality of layers or sections of the same or different materials. For example, but not by way of limitation, a substrate 402 may include one or more paper layers or sections and one or more plastic layers or sections that are laminated or otherwise coupled together to form the composite substrate (e.g., a paper layer/plastic layer/paper layer or plastic layer/paper layer/plastic layer composite substrate). In addition, although inanimate, solid articles are discussed herein, it is to be understood that an "article" also may include a human, an animal, a biological specimen, a liquid sample, and virtually any other object or material into or onto which a luminescent material of an embodiment may be included.

Surface-applied authentication feature 404 may be, for example but not by way of limitation, a printed authentication feature or an authentication feature that includes one or more rigid or flexible materials into which or onto which luminescent particles 100 as described herein are included. For example, but not by way of limitation, the surface-applied authentication feature 404 may include an ink, pigment, coating, or paint that includes the luminescent particles 100. Alternatively, the surface-applied authentication feature 404 may include one or more rigid or flexible materials into which or onto which the luminescent particles 100 are included, where the surface-applied authentication feature 404 is then adhered or otherwise attached to the surface 408 of the substrate 402. According to various embodiments, surface-applied authentication feature 404 may have a thickness 412 of about one micron or more, and surface-applied authentication feature 404 may have a width and length that is less than or equal to the width and length of the substrate 402.

Embedded authentication feature 406 may include one or more rigid or flexible materials in which or onto which the luminescent particles 100 as described herein is included. For example, but not by way of limitation, embedded authentication feature 406 may be configured in the form of a discrete, rigid or flexible substrate, a security thread, or another type of structure. According to various embodiments, embedded authentication feature 406 may have a thickness 422 in a range of about one micron up to the thickness 416 of the substrate 402, and embedded authentication feature 406 may have a width and length that is less than or equal to the width and length of the substrate 402.

As mentioned above, the luminescent particles 100 may be evenly or unevenly dispersed within substrate 402, as shown in FIG. 4, or within one or more other components of the article 400 (e.g., within one or more layers or other components of the article 400), in other embodiments. The luminescent particles 100 may be dispersed within substrate 402 or another component, for example but not by way of limitation, by mixing the luminescent particles 100 into the material that is employed to form the substrate 402 or other component, and/or by impregnating the substrate 402 or other component with a colloidal dispersion of the luminescent particles 100, as discussed previously.

The absorption and emission properties of embodiments of luminescent benzothiazoles as described herein are consistent with their use in conjunction with security and authentication features. For example, using relatively conventional authentication equipment, embodiments of luminescent materials may be readily excited and the emissions detected through conventional techniques.

The following Examples are intended to supplement, and not to limit, the description of the luminescent particles and methods of producing the same as described above.

Examples

N-[2-(2-benzothiazolyl)phenyl]-N'-phenyl-urea (Formula I)

As a first example of a luminescent particle produced in accordance with the methods described herein, N-[2-(2-benzothiazolyl)phenyl]-N'-phenyl-urea was prepared according to the following reaction scheme:

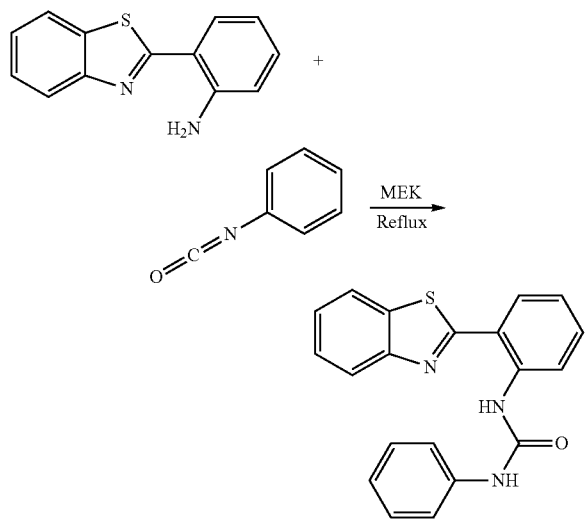

To prepare the luminescent particles, a 1 L three neck flask (equipped with thermometer, stirrer and dropping funnel) was charged at room temperature with 200 g 2-Butanone (i.e., methyl ethyl ketone) and 40 g of 2-Aminophenylbenzothiazole (0.176 mol) to form a mixture. The mixture was heated to smooth reflux (the mixture turned into a pale brownish opaque solution). Under reflux and stirring, 23.1 g of Phenylisocyanate (0.194 mol) was added within 75 minutes to form a reaction mixture. After about ⅓ of the Phenylisocyanate was added, a bright beige material precipitated from solution. For better stirring, the reaction mixture was diluted with 150 g of 2-Butanone. The reaction mixture was stirred for an additional 2.5 hours under smooth reflux. After this time, the reaction mixture was cooled to 25° C. and the precipitate was isolated by Nutsch suction and washed at room temperature with 300 ml Acetone. The precipitate was dried at 60° C. in a drying oven. The precipitate, after drying, was weighed at 47.9 g to provide a yield of about 78% based upon theoretical yield. Melting point of the precipitate was determined to be from about 212 to about 214° C., a DTA peak (endotherm) was determined to be about 228° C., and purity (i.e., luminescent benzothiazole content) was determined to be 99.8% as determined through HPLC. The precipitate exhibited bright yellowish orange fluorescence under excitation with 366 nm wavelength, with a peak emission at about 572 nm. CIE color coordinates were determined to be X=0.508, Y=0.486 as measured using a Spectrofluorometer FluoroMax-4 from Horiba Jobin Yvon GmbH. FIG. 1 is a graph illustrating excitation and emission spectra for luminescent particles in accordance with this Example.

N-[2-(2-benzothiazolyl)phenyl]-N'-(4-chlorophenyl)-urea (Formula II)

As another example of a luminescent particle produced in accordance with the methods described herein, N-[2-(2-benzothiazolyl)phenyl]-N'-(4-chlorophenyl)-urea was prepared according to the following reaction scheme:

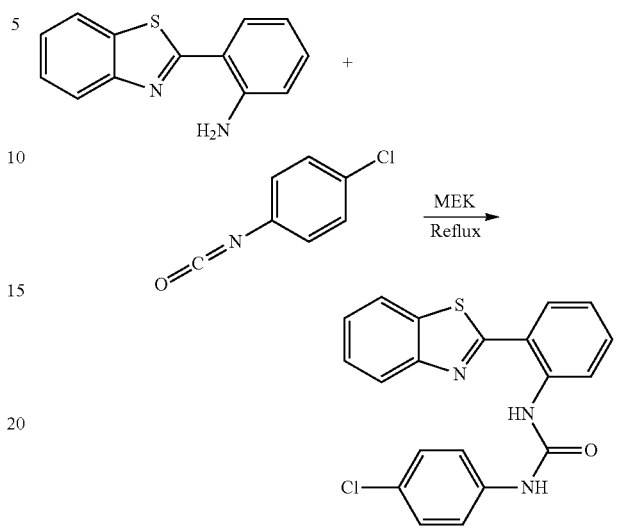

To prepare the luminescent particles, a 1 L three neck flask (equipped with thermometer, stirrer and dropping funnel) was charged at room temperature with 200 g 2-Butanone (i.e., methyl ethyl ketone) and 40 g of 2-Aminophenylbenzothiazole (0.176 mol) to form a mixture. The mixture was heated to smooth reflux (the mixture turned into a pale brownish opaque solution). Under reflux and stirring, 29.8 g of 4-Chloro-phenylisocyanate (0.194 mol) was added within 75 minutes to form a reaction mixture. After about ⅓ of the 4-Chloro-phenylisocyanate was added, a bright beige material precipitated from solution. For better stirring, the reaction mixture was diluted with 150 g of 2-Butanone. The reaction mixture was stirred for an additional 2.5 hours under smooth reflux. After this time, the reaction mixture was cooled to 25° C. and the precipitate was isolated by Nutsch suction and washed at room temperature with 300 ml Acetone. The precipitate was dried at 60° C. in a drying oven. The precipitate, after drying, was weighed at 60.4 g to provide a yield of about 90% based upon theoretical yield. Melting point of the precipitate was determined to be from about 220 to about 224° C., a DTA peak (endotherm) was determined to be about 235° C., and purity (i.e., luminescent benzothiazole content) was determined to be 99.5% as determined through High Performance Liquid Chromatography (HPLC). The precipitate exhibited bright yellowish orange fluorescence under excitation with 366 nm wavelength, with a peak emission at about 573 nm. CIE color coordinates were determined to be X=0.505, Y=0.489 as measured using a Spectrofluorometer FluoroMax-4 from Horiba Jobin Yvon GmbH. FIG. 2 is a graph illustrating excitation and emission spectra for luminescent particles in accordance with this Example.

N-[2-(2-benzothiazolyl)phenyl]-N'-(4-methylphenyl)-urea (Formula III)

As another example of a luminescent particle produced in accordance with the methods described herein, N-[2-(2-benzothiazolyl)phenyl]-N'-(4-methylphenyl)-urea was prepared according to the following reaction scheme:

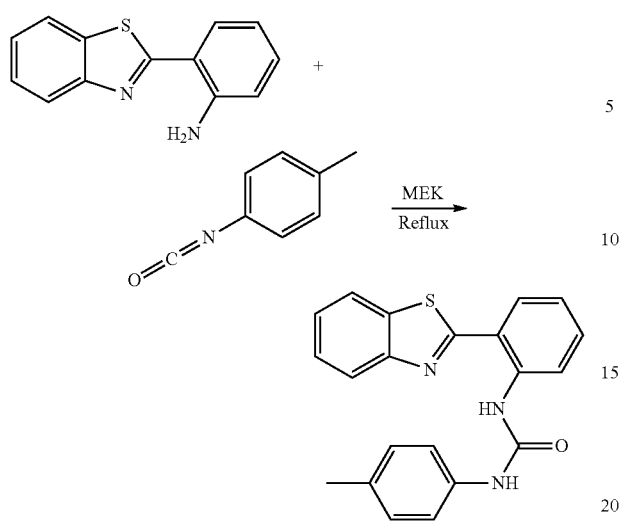

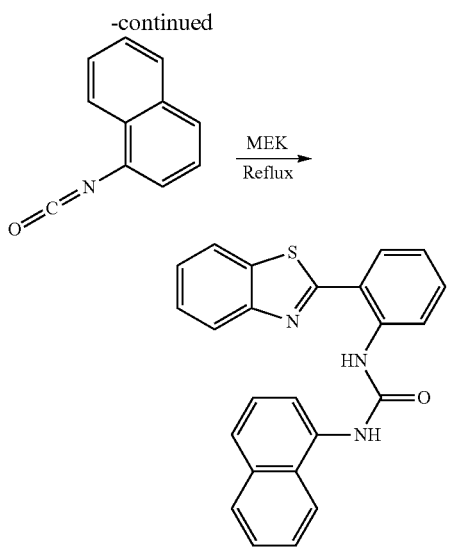

To prepare the luminescent particles, a 500 ml three neck flask (equipped with thermometer, stirrer and dropping funnel) was charged at room temperature with 150 g Butanone and 36.9 g of 2-Aminophenylbenzothiazole (0.163 mol) to form a mixture. The mixture was heated to smooth reflux (the mixture turned into a pale brownish opaque solution). Under reflux and stirring, 24 g of 4-Methyl-phenylisocyanate (0.194 mol) was added within 100 minutes to form a reaction mixture. After about ⅓ of the 4-Methyl-phenylisocyanate was added, a bright beige material precipitated from solution. The reaction mixture was stirred for an additional 7 hours under smooth reflux. After this time, the reaction mixture was cooled to 45° C. and the precipitate was isolated by Nutsch suction and washed at room temperature with 150 ml Acetone. The product was stirred in 150 ml acetone at reflux for 30 minutes to remove impurities. The precipitate was dried at 60° C. in a drying oven. The precipitate, after drying, was weighed at 49.7 g to provide a yield of about 85% based upon theoretical yield. Melting point of the precipitate was determined to be from about 200 to about 203° C., a DTA peak (endotherm) was determined to be about 216° C., and purity (i.e., luminescent benzothiazole content) was determined to be 99.9% as determined through High Performance Liquid Chromatography (HPLC). The precipitate exhibited bright yellow fluorescence under excitation with 366 nm wavelength, with a peak emission at about 569 nm. CIE color coordinates were determined to be X=0.502, Y=0.493 as measured using a Spectrofluorometer FluoroMax-4 from Horiba Jobin Yvon GmbH.

N-[2-(2-benzothiazolyl)phenyl]-N'-(1-naphthyl)-urea (Formula IV)

As another example of a luminescent particle produced in accordance with the methods described herein, N-[2-(2-benzothiazolyl)phenyl]-N'-(1-naphthyl)-urea was prepared according to the following reaction scheme:

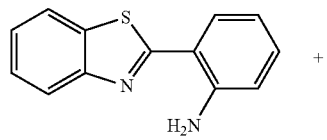

To prepare the luminescent particles, a 500 ml three neck flask (equipped with thermometer, stirrer and dropping funnel) was charged at room temperature with 150 g Butanone and 29.1 g of 2-Aminophenylbenzothiazole (0.129 mol) to form a mixture. The mixture was heated to smooth reflux (the mixture turned into a pale brownish opaque solution). Under reflux and stirring, 24 g of 1-Naphthylisocyanate (0.142 mol) was added within 80 minutes to form a reaction mixture. After about ⅔ of the 1-Naphthylisocyanate was added, a bright beige material precipitated from solution. The reaction mixture was stirred for an additional 8.5 hours under smooth reflux. After this time, the reaction mixture was cooled to 25° C. and the precipitate was isolated by Nutsch suction and washed at room temperature with 200 ml Acetone. The product was stirred in 200 ml acetone at reflux for 30 minutes to remove impurities. The precipitate was dried at 60° C. in a drying oven. The precipitate, after drying, was weighed at 46.4 g to provide a yield of about 91% based upon theoretical yield. Melting point of the precipitate was determined to be from about 206 to about 250° C., a DTA peak (endotherm) was determined to be about 216° C., and purity (i.e., luminescent benzothiazole content) was determined to be 95.3% as determined through High Performance Liquid Chromatography (HPLC). The precipitate exhibited bright yellow fluorescence under excitation with 366 nm wavelength, with a peak emission at about 566 nm. CIE color coordinates were determined to be X=0.487, Y=0.504 as measured using a Spectrofluorometer FluoroMax-4 from Horiba Jobin Yvon GmbH.

Methyl-4-(3-(2-(benzo[d]thiazol-2-yl)phenyl)ureido) benzoate (Formula V)

As another example of a luminescent particle produced in accordance with the methods described herein, Methyl-4-(3-(2-(benzo[d]thiazol-2-yl)phenyl)ureido)benzoate was prepared according to the following reaction scheme:

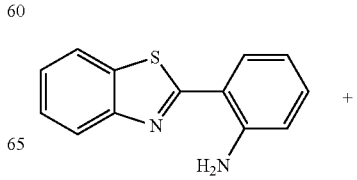

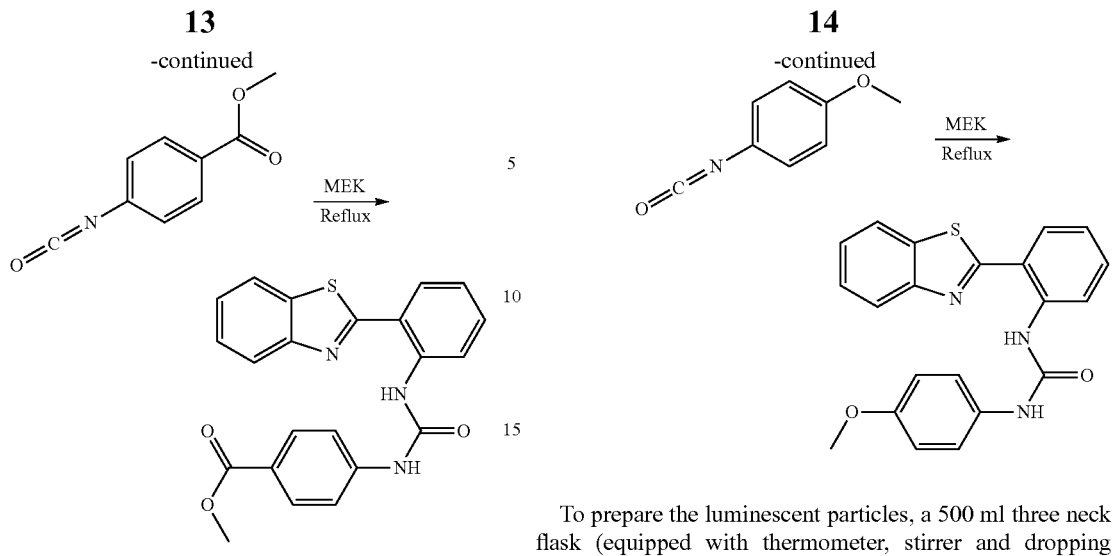

To prepare the luminescent particles, a 500 ml three neck flask (equipped with thermometer, stirrer and dropping funnel) was charged at room temperature with 150 g Butanone and 27.8 g of 2-Aminophenylbenzothiazole (0.123 mol) to form a mixture. The mixture was heated to smooth reflux (the mixture turned into a pale brownish opaque solution). Under reflux and stirring, 24 g of Methyl-4-isocyanatobenzoate (0.135 mol) that was dissolved in 25 g Butanone was added within 75 minutes to form a reaction mixture. After about ⅓ of the Methyl-4-isocyanatobenzoate was added, a bright beige material precipitated from solution. The reaction mixture was stirred for an additional 4 hours under smooth reflux. After this time, the reaction mixture was cooled to 40° C. and the precipitate was isolated by Nutsch suction and washed at room temperature with 150 ml Acetone. The product was stirred in 150 ml acetone at reflux for 30 minutes to remove impurities. The precipitate was dried at 60° C. in a drying oven. The precipitate, after drying, was weighed at 37.8 g to provide a yield of about 76% based upon theoretical yield. Melting point of the precipitate was determined to be from about 197 to about 199° C., a DTA peak (endotherm) was determined to be about 214° C., and purity (i.e., luminescent benzothiazole content) was determined to be 99.6% as determined through High Performance Liquid Chromatography (HPLC). The precipitate exhibited bright yellow fluorescence under excitation with 366 nm wavelength, with a peak emission at about 566 nm. CIE color coordinates were determined to be X=0.484, Y=0.507 as measured using a Spectrofluorometer FluoroMax-4 from Horiba Jobin Yvon GmbH.

N-[2-(2-benzothiazolyl)phenyl]-N'-(4-methoxyphenyl)-urea (Formula VI)

As another example of a luminescent particle produced in accordance with the methods described herein, N-[2-(2-benzothiazolyl)phenyl]-N'-(4-methoxyphenyl)-urea was prepared according to the following reaction scheme:

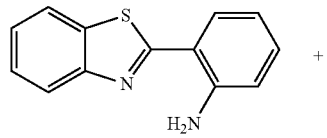

To prepare the luminescent particles, a 500 ml three neck flask (equipped with thermometer, stirrer and dropping funnel) was charged at room temperature with 150 g Butanone and 33.2 g of 2-Aminophenylbenzothiazole (0.146 mol) to form a mixture. The mixture was heated to smooth reflux (the mixture turned into a pale brownish opaque solution). Under reflux and stirring, 24 g of 4-Methoxy-phenylisocyanate (0.161 mol) was added within 90 minutes to form a reaction mixture. After about ⅓ of the 4-Methoxy-phenylisocyanate was added, a bright beige material precipitated from solution. For better stirring the reaction mixture was diluted with 50 g Butanone. The reaction mixture was stirred for an additional 5.5 hours under smooth reflux. After this time, the reaction mixture was cooled to 50° C. and the precipitate was isolated by Nutsch suction and washed at room temperature with 150 ml Acetone. The product was stirred in 200 ml acetone at reflux for 30 minutes to remove impurities. The precipitate was dried at 60° C. in a drying oven. The precipitate, after drying, was weighed at 48.9 g to provide a yield of about 89% based upon theoretical yield. Melting point of the precipitate was determined to be from about 211 to about 216° C., a DTA peak (endotherm) was determined to be about 229° C., and purity (i.e., luminescent benzothiazole content) was determined to be 97.4% as determined through High Performance Liquid Chromatography (HPLC). The precipitate exhibited bright yellow fluorescence under excitation with 366 nm wavelength, with a peak emission at about 565 nm. CIE color coordinates were determined to be X=0.487, Y=0.506 as measured using a Spectrofluorometer FluoroMax-4 from Horiba Jobin Yvon GmbH.

N-[2-(2-benzothiazolyl)phenyl]-N'-(4-chlorophenyl)-urea (Formula VII)

As another example of a luminescent particle produced in accordance with the methods described herein, N-[2-(2-benzothiazolyl)phenyl]-N'-(4-chlorophenyl)-urea was prepared according to the following reaction scheme:

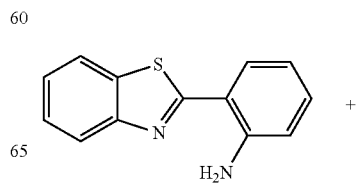

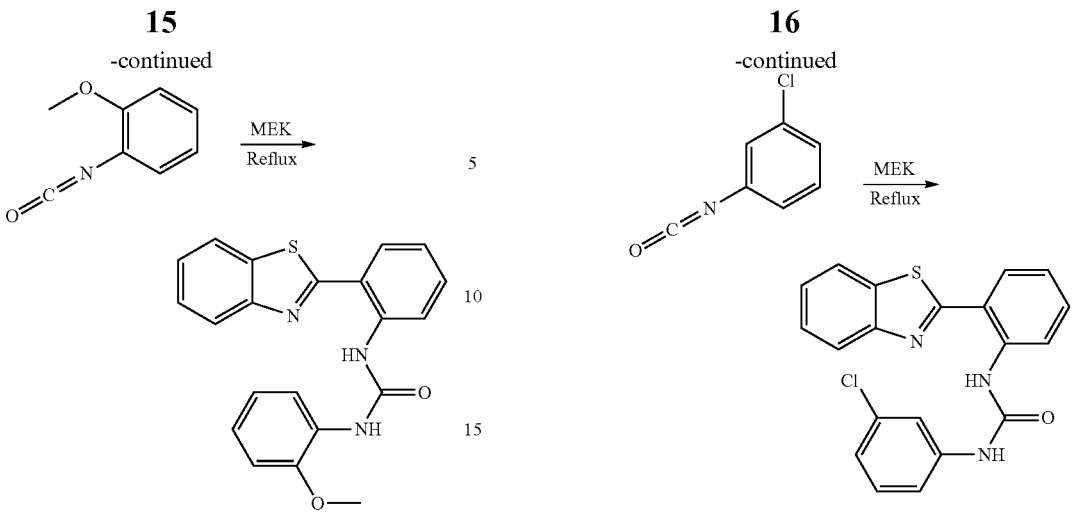

To prepare the luminescent particles, a 500 ml three neck flask (equipped with thermometer, stirrer and dropping funnel) was charged at room temperature with 200 g Butanone and 40 g of 2-Aminophenylbenzothiazole (0.176 mol) to form a mixture. The mixture was heated to smooth reflux (the mixture turned into a pale brownish opaque solution). Under reflux and stirring, 29 g of 2-Methoxy-phenylisocyanate (0.194 mol) was added within 85 minutes to form a reaction mixture. The reaction mixture was stirred for an additional 8.5 hours under smooth reflux. After this time, the reaction mixture was cooled to 40° C. and the precipitate was isolated by Nutsch suction and washed at room temperature with 200 ml Acetone. The product was stirred in 200 ml acetone at reflux for 30 minutes to remove impurities. The precipitate was dried at 60° C. in a drying oven. The precipitate, after drying, was weighed at 35.7 g to provide a yield of about 54% based upon theoretical yield. Melting point of the precipitate was determined to be from about 174 to about 176° C., a DTA peak (endotherm) was determined to be about 184° C., and purity (i.e., luminescent benzothiazole content) was determined to be 99.5% as determined through High Performance Liquid Chromatography (HPLC). The precipitate exhibited bright yellowish orange fluorescence under excitation with 366 nm wavelength, with a peak emission at about 589 nm. CIE color coordinates were determined to be X=0.544, Y=0.450 as measured using a Spectrofluorometer FluoroMax-4 from Horiba Jobin Yvon GmbH.

N-[2-(2-benzothiazolyl)phenyl]-N'-(3-chlorophenyl)-urea (Formula VIII)

As another example of a luminescent particle produced in accordance with the methods described herein, N-[2-(2-benzothiazolyl)phenyl]-N'-(3-chlorophenyl)-urea was prepared according to the following reaction scheme:

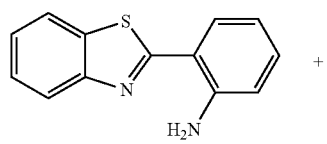

To prepare the luminescent particles, a 500 ml three neck flask (equipped with thermometer, stirrer and dropping funnel) was charged at room temperature with 135 g Butanone and 32 g of 2-Aminophenylbenzothiazole (0.142 mol) to form a mixture. The mixture was heated to smooth reflux (the mixture turned into a pale brownish opaque solution). Under reflux and stirring, 22.3 g of 3-Chloro-phenylisocyanate (0.145 mol) was added within 110 minutes to form a reaction mixture. The reaction mixture was diluted by adding 80 ml Butanone and stirred for an additional 4.5 hours under smooth reflux. After this time, the reaction mixture was cooled to 45° C. and the precipitate was isolated by Nutsch suction and washed at room temperature with 300 ml Acetone. The product was stirred in 200 ml acetone at reflux for 30 minutes to remove impurities. The precipitate was dried at 65° C. in a drying oven. The precipitate, after drying, was weighed at 39.8 g to provide a yield of about 74% based upon theoretical yield. Melting point of the precipitate was determined to be about 190° C., a DTA peak (endotherm) was determined to be about 204° C., and purity (i.e., luminescent benzothiazole content) was determined to be 99.9% as determined through High Performance Liquid Chromatography (HPLC). The precipitate exhibited bright yellowish orange fluorescence under excitation with 366 nm wavelength, with a peak emission at about 583 nm. CIE color coordinates were determined to be X=0.535, Y=0.460 as measured using a Spectrofluorometer FluoroMax-4 from Horiba Jobin Yvon GmbH.

N-[2-(2-benzothiazolyl)phenyl]-N'-(4-chlorophenyl)-urea (Formula IX)

As another example of a luminescent particle produced in accordance with the methods described herein, N-[2-(2-benzothiazolyl)phenyl]-N'-(2-chlorophenyl)-urea was prepared according to the following reaction scheme:

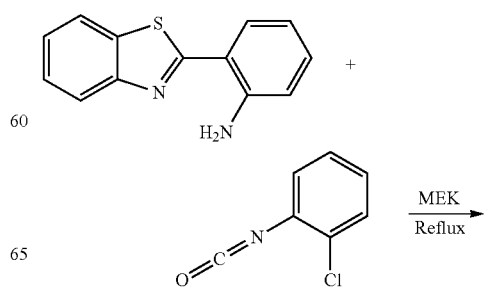

-continued

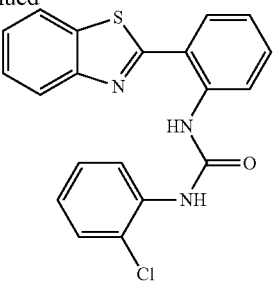

-continued

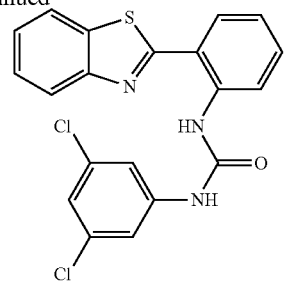

To prepare the luminescent particles, a 500 ml three neck flask (equipped with thermometer, stirrer and dropping funnel) was charged at room temperature with 150 g Butanone and 32.1 g of 2-Aminophenylbenzothiazole (0.142 mol) to form a mixture. The mixture was heated to smooth reflux (the mixture turned into a pale brownish opaque solution). Under reflux and stirring, 22.3 g of 2-Chloro-phenylisocyanate (0.145 mol) was added within 70 minutes to form a reaction mixture. After about ½ of addition of the 2-Chloro-phenylisocyanate, a bright beige material precipitated. The reaction mixture was stirred for an additional 6.5 hours under smooth reflux. After this time, the reaction mixture was cooled to 50° C. and the precipitate was isolated by Nutsch suction and washed at room temperature with 220 ml Acetone. The precipitate was dried at 60° C. in a drying oven. The precipitate, after drying, was weighed at 46 g to provide a yield of about 85% based upon theoretical yield. Melting point of the precipitate was determined to be from about 190 to about 193° C., a DTA peak (endotherm) was determined to be about 202° C., and purity (i.e., luminescent benzothiazole content) was determined to be 98.4% as determined through High Performance Liquid Chromatography (HPLC). The precipitate exhibited bright yellowish orange fluorescence under excitation with 366 nm wavelength, with a peak emission at about 578 nm. CIE color coordinates were determined to be X=0.518, Y=0.472 as measured using a Spectrofluorometer FluoroMax-4 from Horiba Jobin Yvon GmbH.

N-[2-(2-benzothiazolyl)phenyl]-N'-(3,5-dichlorophenyl)-urea (Formula X)

As another example of a luminescent particle produced in accordance with the methods described herein, N-[2-(2-benzothiazolyl)phenyl]-N'-(3,5-dichlorophenyl)-urea was prepared according to the following reaction scheme:

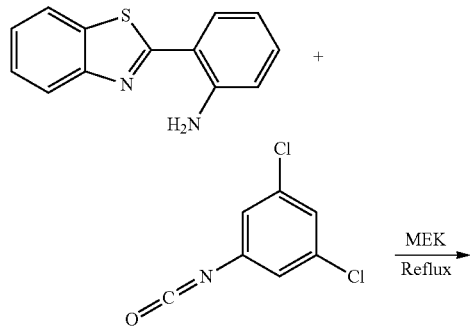

To prepare the luminescent particles, a 250 ml three neck flask (equipped with thermometer, stirrer and dropping funnel) was charged at room temperature with 50 g Butanone and 11.4 g of 2-Aminophenylbenzothiazole (0.051 mol) to form a mixture. The mixture was heated to smooth reflux (the mixture turned into a pale brownish opaque solution). Under reflux and stirring at a mixture temperature of from 75-80° C., 10 g of 3,5-Dichloro-phenylisocyanate (0.053 mol) was added within 90 minutes to form a reaction mixture. The reaction mixture was diluted with an additional 30 ml Butanone and stirred for an additional 3.5 hours under smooth reflux. For decomposition of excess isocyanate, 15 g Ethanol were added and stirred under reflux for 15 minutes. After this time, the reaction mixture was cooled to 25° C. and the precipitate was isolated by Nutsch suction and washed at room temperature with 100 ml Acetone. The precipitate was dried at 65° C. in a drying oven. The precipitate, after drying, was weighed at 19.1 g to provide a yield of about 91% based upon theoretical yield. Melting point of the precipitate was determined to be from about 219 to about 221° C., a DTA peak (endotherm) was determined to be about 223° C., and purity (i.e., luminescent benzothiazole content) was determined to be 97.1% as determined through High Performance Liquid Chromatography (HPLC). The precipitate exhibited bright greenish yellow fluorescence under excitation with 366 nm wavelength, with a peak emission at about 558 nm. CIE color coordinates were determined to be X=0.453, Y=0.537 as measured using a Spectrofluorometer FluoroMax-4 from Horiba Jobin Yvon GmbH.

N-[2-(2-benzothiazolyl)phenyl]-N'-(3,4-dichlorophenyl)-urea (Formula XI)

As another example of a luminescent particle produced in accordance with the methods described herein, N-[2-(2-benzothiazolyl)phenyl]-N'-(3,4-dichlorophenyl)-urea was prepared according to the following reaction scheme:

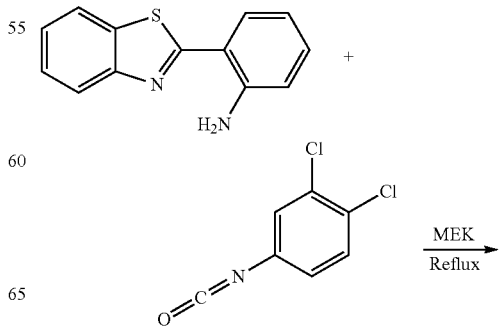

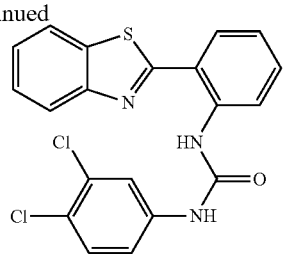

To prepare the luminescent particles, a 250 ml three neck flask (equipped with thermometer, stirrer and dropping funnel) was charged at room temperature with 50 g Butanone and 11.4 g of 2-Aminophenylbenzothiazole (0.051 mol) to form a mixture. The mixture was heated to smooth reflux (the mixture turned into a pale brownish opaque solution). Under reflux and stirring at a mixture temperature of from 75-80° C., 10 g of 3,4-Dichloro-phenylisocyanate dissolved in 25 g Butanone was added within 110 minutes to form a reaction mixture. The reaction mixture was diluted with an additional 30 ml Butanone and stirred for an additional 4 hours under smooth reflux. For decomposition of excess isocyanate, 15 g Ethanol were added and stirred under reflux for 15 minutes. After this time, the reaction mixture was cooled to 25° C. and the precipitate was isolated by Nutsch suction and washed at room temperature with 150 ml Acetone. The precipitate was dried at 65° C. in a drying oven. The precipitate, after drying, was weighed at 17 g to provide a yield of about 81% based upon theoretical yield. Melting point of the precipitate was determined to be from about 202 to about 205° C., a DTA peak (endotherm) was determined to be about 213° C., and purity (i.e., luminescent benzothiazole content) was determined to be 99.4% as determined through High Performance Liquid Chromatography (HPLC). The precipitate exhibited bright yellow fluorescence under excitation with 366 nm wavelength, with a peak emission at about 564 nm. CIE color coordinates were determined to be X=0.485, Y=0.509 as measured using a Spectrofluorometer FluoroMax-4 from Horiba Jobin Yvon GmbH.

1-(2-(benzo[d]thiazol-2-yl)-4-chlorophenyl)-3-(3-chlorophenyl)urea (Formula XI)

As another example of a luminescent particle produced in accordance with the methods described herein, 1-(2-(benzo[d]thiazol-2-yl)-4-chlorophenyl)-3-(3-chlorophenyl)urea was prepared according to the following reaction scheme:

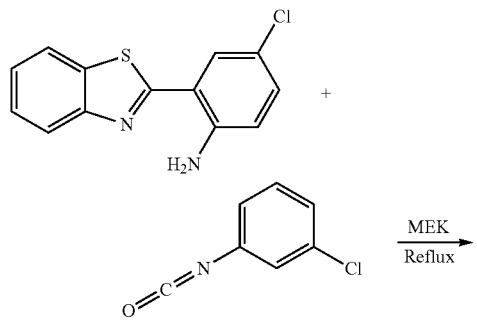

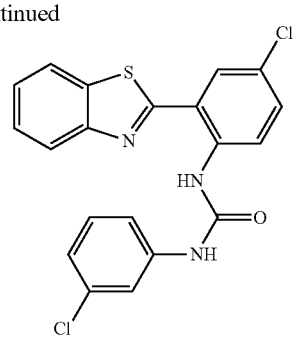

To prepare the luminescent particles, a 250 ml three neck flask (equipped with thermometer, stirrer and dropping funnel) was charged at room temperature with 50 g Butanone and 13 g of 2-Amino-5-chlorophenylbenzothiazole (0.05 mol) to form a mixture. The mixture was heated to smooth reflux (the mixture turned into a pale brownish opaque solution). Under reflux and stirring at a mixture temperature of from 75-80° C., 8.4 g of 3-Chloro-phenylisocyanate dissolved in 20 g Butanone was added within 65 minutes to form a reaction mixture. The reaction mixture was diluted with an additional 20 ml Butanone and stirred for an additional 3.5 hours under smooth reflux. For decomposition of excess isocyanate, 15 g Ethanol were added and stirred under reflux for 15 minutes. After this time, the reaction mixture was cooled to 30° C. and the precipitate was isolated by Nutsch suction and washed at room temperature with 100 ml Acetone. The precipitate was dried at 65° C. in a drying oven. The precipitate, after drying, was weighed at 19.4 g to provide a yield of about 93% based upon theoretical yield. Melting point of the precipitate was determined to be about 250° C., a DTA peak (endotherm) was determined to be about 253° C., and purity (i.e., luminescent benzothiazole content) was determined to be 99.2% as determined through High Performance Liquid Chromatography (HPLC). The precipitate exhibited bright yellow fluorescence under excitation with 366 nm wavelength, with a peak emission at about 573 nm. CIE color coordinates were determined to be X=0.517, Y=0.478 as measured using a Spectrofluorometer FluoroMax-4 from Horiba Jobin Yvon GmbH.

1-(2-(benzo[d]thiazol-2-yl)-4-chlorophenyl)-3-phenylurea (Formula XIII)

As another example of a luminescent particle produced in accordance with the methods described herein, 1-(2-(benzo[d]thiazol-2-yl)-4-chlorophenyl)-3-phenylurea was prepared according to the following reaction scheme:

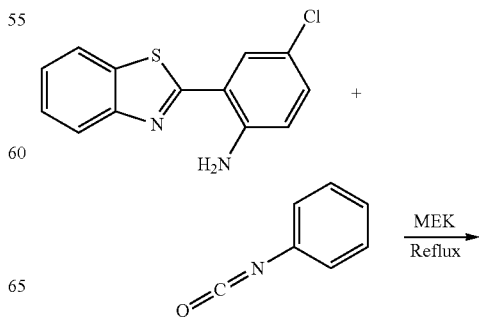

-continued

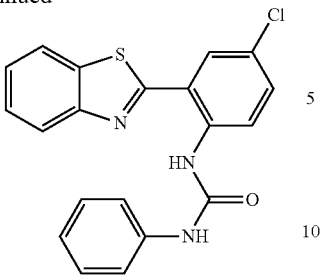

To prepare the luminescent particles, a 250 ml three neck flask (equipped with thermometer, stirrer and dropping funnel) was charged at room temperature with 50 g Butanone and 13 g of 2-Amino-5-chlorophenylbenzothiazole (0.05 mol) to form a mixture. The mixture was heated to smooth reflux (the mixture turned into a pale brownish opaque solution). Under reflux and stirring at a mixture temperature of from 75-80° C., 6.5 g of Phenylisocyanate dissolved in 20 g Butanone was added within 70 minutes to form a reaction mixture. To complete the reaction an addition 2 ml of Phenylisocyanate were added and stirred under reflux for an additional 4.5 hours. For decomposition of excess isocyanate, 10 g Ethanol were added and stirred under reflux for 15 minutes. After this time, the reaction mixture was cooled to 35° C. and the precipitate was isolated by Nutsch suction and washed at room temperature with 100 ml Acetone. The precipitate was dried at 65° C. in a drying oven. The precipitate, after drying, was weighed at 16.2 g to provide a yield of about 85% based upon theoretical yield. Melting point of the precipitate was determined to be about 257° C., a DTA peak (endotherm) was determined to be about 257° C., and purity (i.e., luminescent benzothiazole content) was determined to be 98.8% as determined through High Performance Liquid Chromatography (HPLC). The precipitate exhibited bright yellow fluorescence under excitation with 366 nm wavelength, with a peak emission at about 589 nm. CIE color coordinates were determined to be X=0.558, Y=0.435 as measured using a Spectrofluorometer FluoroMax-4 from Horiba Jobin Yvon GmbH.

Luminescent Material Including Fibers Dyed with Luminescent Particles

In a dying procedure, 50 g Polyamide microfibers (22 dtex/3 mm) in 900 g water were treated with 0.2 g of luminescent particles of Formula I for 4 hours at 60-85° C. The fibers were then isolated and dried, and the resulting fibers were colorless. The fibers show a bathochromic shift with fluorescence maximum at 582 nm. CIE Color coordinates (X=0.503, Y=0.445)

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration in any way. Rather, the foregoing detailed description will provide those skilled in the art with a convenient road map for implementing an exemplary embodiment. It being understood that various changes may be made in the function and arrangement of elements described in an exemplary embodiment without departing from the scope as set forth in the appended claims.

What is claimed is:

1. A luminescent material comprising:
   a medium chosen from the group of an ink, an ink additive, a glue, a polymer, a plastic, plastic base resin, a glass, a ceramic, a metal, a textile, wood, fiber, paper pulp, and paper; and
   luminescent particles comprising a luminescent benzothiazole having a ureido linkage, wherein
      the ureido linkage joins a benzothiazolyl-containing group and an optionally halogenated phenyl group in the luminescent benzothiazole;
      the benzothiazolyl-containing group is a phenylbenzothiazolyl group wherein the ureido linkage joins the phenylbenzothiazolyl group to the optionally halogenated phenyl group in the luminescent benzothiazole; and
      the phenylbenzothiazolyl group is free from pendant hydroxyl groups;
   wherein the luminescent particles comprise the luminescent benzothiazole in an amount of at least 99 weight % based upon a total weight of the luminescent particles.

2. The luminescent material of claim 1, wherein the luminescent benzothiazole has the following structure:

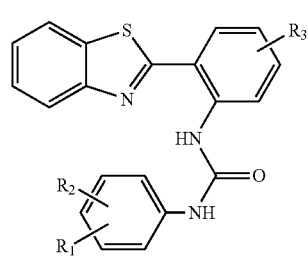

(I)

wherein $R_1$ is H, a halogen radical, an alkyl group, an ester group, an ether group, an aromatic group, or an alkoxy group; $R_2$ is H, a halogen radical, an alkyl group, an ester group, an ether group, an aromatic group, or an alkoxy group, wherein $R_1$ and $R_2$ may represent bonds of an aromatic group to the phenyl group to form a polycyclic aromatic group; and $R_3$ is H, a halogen radical, or an alkyl group.

3. The luminescent material of claim 2, wherein $R_1$ is H, a halogen radical, an alkyl group, an ester group, an ether group, an aromatic group, or an alkoxy group; $R_2$ is H; and $R_3$ is H.

4. The luminescent material of claim 1, wherein the luminescent benzothiazole is the reaction product of 2-aminophenylbenzothiazole and an optionally halogenated phenylisocyanate.

5. A method of forming luminescent particles, wherein the method comprises:
   heating a mixture comprising an amino-functional benzothiazole reactant and an organic solvent to a temperature of greater than about 60° C.;
   adding an isocyanate-containing compound to the mixture after heating to the temperature of greater than about 60° C. to form a reaction mixture;
   maintaining the reaction mixture at the temperature of greater than about 60° C. for a reaction period to form luminescent particles comprising a luminescent benzothiazole having a ureido linkage.

6. The method of claim 5, further comprising separating the luminescent particles as precipitate from a liquid portion of the reaction mixture after the reaction period.

7. The method of claim 5, wherein heating the mixture comprises heating the mixture to reflux conditions wherein vapor from the mixture is returned to the mixture prior to adding the isocyanate-containing compound.

8. The method of claim 5, wherein the luminescent particles are formed at a yield of at least 75 weight % based upon a theoretical yield of the luminescent particles from the reaction.

9. The method of claim 5, wherein the amino-functional benzothiazole reactant is 2-aminophenylbenzothiazole and the isocyanate-containing compound is an optionally halogenated phenylisocyanate.

10. The method of claim 9, wherein the isocyanate-containing compound is a halogenated phenylisocyanate.

11. A luminescent material comprising:
- a medium chosen from the group of an ink, an ink additive, a glue, a polymer, a plastic, plastic base resin, a glass, a ceramic, a metal, a textile, wood, fiber, paper pulp, and paper; and
- luminescent particles comprising a luminescent benzothiazole having a ureido linkage, wherein
    - the ureido linkage joins a benzothiazolyl-containing group and an optionally halogenated phenyl group in the luminescent benzothiazole;
    - the benzothiazolyl-containing group is a phenylbenzothiazolyl group wherein the ureido linkage joins the phenylbenzothiazolyl group to the optionally halogenated phenyl group in the luminescent benzothiazole;
    - wherein the phenylbenzothiazolyl group is free from pendant hydroxyl groups.

* * * * *